(12) United States Patent
Nakagawa

(10) Patent No.: US 7,868,418 B2
(45) Date of Patent: Jan. 11, 2011

(54) SEMICONDUCTOR DEVICE

(75) Inventor: Akio Nakagawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 479 days.

(21) Appl. No.: 12/050,822

(22) Filed: Mar. 18, 2008

(65) Prior Publication Data

US 2008/0185640 A1 Aug. 7, 2008

Related U.S. Application Data

(63) Continuation of application No. 11/477,454, filed on Jun. 30, 2006, now Pat. No. 7,358,566.

(30) Foreign Application Priority Data

Jul. 1, 2005 (JP) ............................ 2005-193597

(51) Int. Cl.
*H01L 29/06* (2006.01)
(52) U.S. Cl. ...................... 257/531; 257/532; 257/679; 257/E29.009
(58) Field of Classification Search .................. 257/531, 257/532, 679, E29.009
See application file for complete search history.

(56) References Cited

U.S. PATENT DOCUMENTS

| 6,114,727 | A * | 9/2000 | Ogura et al. ................ 257/342 |
| 6,395,604 | B1 * | 5/2002 | Kubo et al. .................. 438/270 |
| 6,821,824 | B2 * | 11/2004 | Minato et al. ............... 438/138 |
| 6,844,592 | B2 * | 1/2005 | Yamaguchi et al. ......... 257/341 |
| 6,878,989 | B2 * | 4/2005 | Izumisawa et al. .......... 257/328 |
| 7,112,519 | B2 * | 9/2006 | Yamaguchi et al. ......... 438/524 |
| 7,161,209 | B2 * | 1/2007 | Saito et al. .................. 257/341 |

| 2002/0175368 | A1 * | 11/2002 | Izumisawa et al. ........... 257/341 |
| 2004/0016962 | A1 * | 1/2004 | Okumura et al. ............. 257/330 |

(Continued)

FOREIGN PATENT DOCUMENTS

JP 8-306914 11/1996

(Continued)

OTHER PUBLICATIONS

Yoshiyuki Hattori, et al., "Design of a 200V Super Junction MOSFET with n-buffer regions and its Fabrication by Trench Filling", Proceedings of 2004 International Symposium on Power Semiconductor Devices & ICs, Kitakyushu, May 2004, pp. 189-192.

*Primary Examiner*—Victor A Mandala
(74) *Attorney, Agent, or Firm*—Oblon, Spivak, McClelland, Maier & Neustadt, L.L.P.

(57) ABSTRACT

A first main electrode is provided on one surface thereof. On the other surface thereof, a second semiconductor layer of the first conduction type and a third semiconductor layer of the second conduction type are arranged alternately along the surface. A fourth semiconductor layer of the second conduction type and a fifth semiconductor layer of the first conduction type are stacked on the surfaces of the second and third semiconductor layers. The semiconductor device further comprises a control electrode formed in a trench with an insulator interposed therebetween. The trench passes through the fourth and fifth semiconductor layers and reaches the second semiconductor layer. A sixth semiconductor layer of the first conduction type is diffused from the bottom of the trench. A second main electrode is connected to the fourth and fifth semiconductor layers.

22 Claims, 8 Drawing Sheets

U.S. PATENT DOCUMENTS

2004/0238882 A1* 12/2004 Suzuki et al. ............... 257/330
2005/0156235 A1* 7/2005 Fujihira ...................... 257/341
2007/0018243 A1* 1/2007 Ono et al. ................... 257/330

FOREIGN PATENT DOCUMENTS

| JP | 2003-124464 | 4/2003 |
| JP | 2005-5655 | 1/2005 |
| JP | 2005-522052 | 7/2005 |
| WO | WO 03/085722 A2 | 10/2003 |

* cited by examiner

SEMICONDUCTOR DEVICE

CROSS REFERENCE TO RELATED APPLICATION

This application is a Continuation of and claims the benefit of priority under 35 USC §120 from U.S. Ser. No. 11/477,454, filed Jun. 30, 2006, and claims the benefit of priority under 35 U.S.C. §119 from Japanese Patent Application No. 2005-193597, filed on Jul. 1, 2005, the entire contents of each of which are incorporated herein by reference.

BACKGROUND OF THE INVENTION

1. Field of the Invention

The present invention relates to a semiconductor device having a superjunction (hereinafter referred to as "SJ") structure, such as an SJ MOSFET.

2. Description of the Related Art

A conventional SJ MOSFET is manufactured by forming a p-type body layer (base layer) on a substrate having an SJ structure including n-type columns and p-type columns arranged alternately along the surface, and forming an n-type source diffusion layer on the surface of the p-type body layer. When the column is patterned as fine as 2 µm or below, for example, the above-described structure has a limit in fine patterning because the body layer can not be made sufficiently small.

On the other hand, a trench-gate SJ MOSFET is known as a structure suitable for fine patterning. In the case of the trench-gate, positions for formation of n-type columns and p-type columns may deviate from positions for formation of trench-gates along the surface, or etching or the like for formation of trenches may advance deeper than an intended depth and reach the p-type column. In such the cases, a carrier passage can not be formed from the p-type body layer to the n-type column and an overall on-resistance of the semiconductor device is increased as a problem.

With regard to this problem, JP-A 2003-124464 (paragraph 0038, FIG. 1) discloses an SJ MOSFET including an n-type silicon region formed in a region that contains almost the entire of a carrier passage. This carrier passage links then-type column and the p-type column that cover the bottom of a trench-gate.

Even in the SJ MOSFET disclosed in the above-described document, it is required to form the n-type silicon region in consideration of displacements of the trench along the surface and in the vertical direction. Therefore, the n-type silicon region inevitably has a large width and depth, which ultimately limits fine patterning.

SUMMARY OF THE INVENTION

In a first aspect the present invention provides a semiconductor device, comprising: a first semiconductor layer of the first conduction type; a first main electrode formed on one surface of the first semiconductor layer; a second semiconductor layer of the first conduction type and a third semiconductor layer of the second conduction type formed on the other surface of the first semiconductor layer, the third semiconductor layer arranged periodically along the surface in association with the second semiconductor layer; a fourth semiconductor layer of the second conduction type formed on the surfaces of the second semiconductor layer and the third semiconductor layer; a fifth semiconductor layer of the first conduction type formed on the surface of the fourth semiconductor layer; a control electrode formed in a trench with an insulator interposed therebetween, the trench passing through the fourth and fifth semiconductor layers and reaching the second semiconductor layer; a sixth semiconductor layer of the first conduction type diffused from the bottom of the trench; and a second main electrode connected to the fourth and fifth semiconductor layers.

In a second aspect the present invention provides a semiconductor device, comprising: a first semiconductor layer of the first conduction type; a first main electrode formed on one surface of the first semiconductor layer; a second semiconductor layer of the first conduction type and a third semiconductor layer of the second conduction type formed on the other surface of the first semiconductor layer, the third semiconductor layer arranged periodically along the surface in association with the second semiconductor layer; a fourth semiconductor layer of the second conduction type formed on the surfaces of the second semiconductor layer and the third semiconductor layer; a fifth semiconductor layer of the first conduction type formed on the surface of the fourth semiconductor layer; a control electrode formed in a trench with an insulator interposed therebetween, the trench passing through the fourth and fifth semiconductor layers and reaching the second semiconductor layer; and a second main electrode connected to the fourth and fifth semiconductor layers, wherein the third semiconductor layer has a width in a direction of arrangement in association with the second semiconductor layer made narrower than the width of the second semiconductor layer in the direction of arrangement or the width of the trench in the direction of arrangement.

In a third aspect the present invention provides a semiconductor device, comprising: a first semiconductor layer of the first conduction type; a first main electrode formed on one surface of the first semiconductor layer; a second semiconductor layer of the first conduction type and a third semiconductor layer of the second conduction type formed on the other surface of the first semiconductor layer, the third semiconductor layer arranged periodically along the surface in association with the second semiconductor layer; a fourth semiconductor layer of the second conduction type formed on the surfaces of the second semiconductor layer and the third semiconductor layer; a fifth semiconductor layer of the first conduction type formed on the surface of the fourth semiconductor layer; a control electrode formed in a trench with an insulator interposed therebetween, the trench passing through the fourth and fifth semiconductor layers and reaching the second semiconductor layer, the trench having a width of the bottom made narrower than widths of other portions; and a second main electrode connected to the fourth and fifth semiconductor layers.

BRIEF DESCRIPTION OF THE DRAWINGS

Preferred embodiments of the present invention will now be described below with reference to the accompanying drawings, in which.

DETAILED DESCRIPTION OF THE INVENTION

The embodiments of the present invention are described below with reference to the drawings.

First Embodiment

Figure 1:
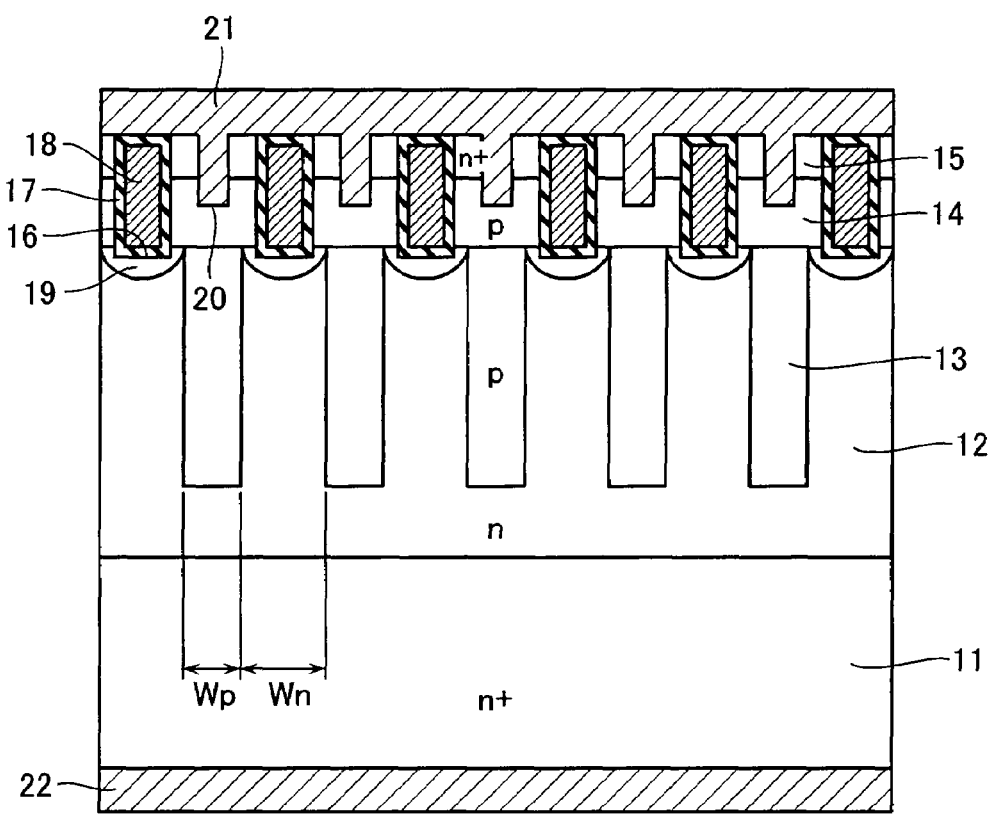
FIG. 1 is a cross-sectional view illustrative of an SJ MOSFET according to a first embodiment of the present invention.

FIG. 1 is a cross-sectional view illustrative of a brief structure of an SJ MOSFET according to a first embodiment of the present invention. FIGS. 2-9 are cross-sectional views illustrative of the same SJ MOSFET in order of process step. An n-channel MOSFET having a p-type base layer is here in described as an example in which the first and second conduction types are defined as n- and p-types, respectively. Alternatively, the first and second conduction types may be defined as p- and n-types, respectively.

An $n^+$-type silicon substrate 11 forms a drain layer. On one surface of the substrate 11, n-type columns 12 and p-type columns 13 are alternately arranged at a certain interval along the surface to form an SJ structure. On the upper surfaces of the n-type columns 12 and the p-type columns 13, a p-type body layer (base layer) 14 is formed, and an $n^+$-type source layer 15 is formed on the p-type body layer 14.

A trench 16 is formed from the $n^+$-type source layer 15 through the p-type body layer 14 to a depth of the n-type column 12. A gate electrode 18 composed of polysilicon or the like is formed as buried in the trench 16 with a gate insulator 17 interposed therebetween. On a portion of the n-type column 12 facing the bottom of the trench 16, an n-type diffusion layer 19 is formed as covering the bottom.

Between adjacent gate electrodes 18, a contact trench 20 is formed from the $n^+$-type source layer 15 to the p-type body layer 14. A source electrode 21 of aluminum is formed as buried in the contact trench 20 to make contacts with the $n^+$-type source layer 15 and the p-type body layer 14 at the same time. On the other surface of the $n^+$-type silicon substrate 11, a drain electrode 22 of aluminum is formed.

Specifically, in this embodiment, widths Wn and Wp in a direction of arrangement of the n- and p-type columns 12 and 13 are made equal to 2 μm or below. The width Wn of the n-type column 12 is made wider than the width Wp of the p-type column 13. This allows the gate electrode 18 to be formed surely on the n-type column 12 even if the trench 16 deviates more or less along the surface.

The following description is given to process steps of manufacturing the SJ MOSFET according to the first embodiment.

Figure 2:
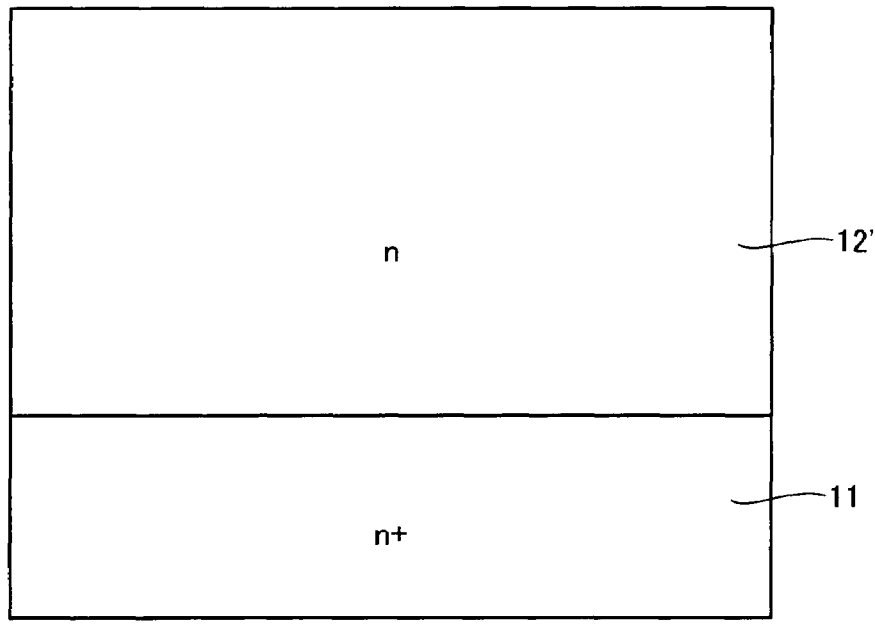
FIG. 2 is a cross-sectional view illustrative of the MOSFET of FIG. 1 in order of process step.
Figure 3:
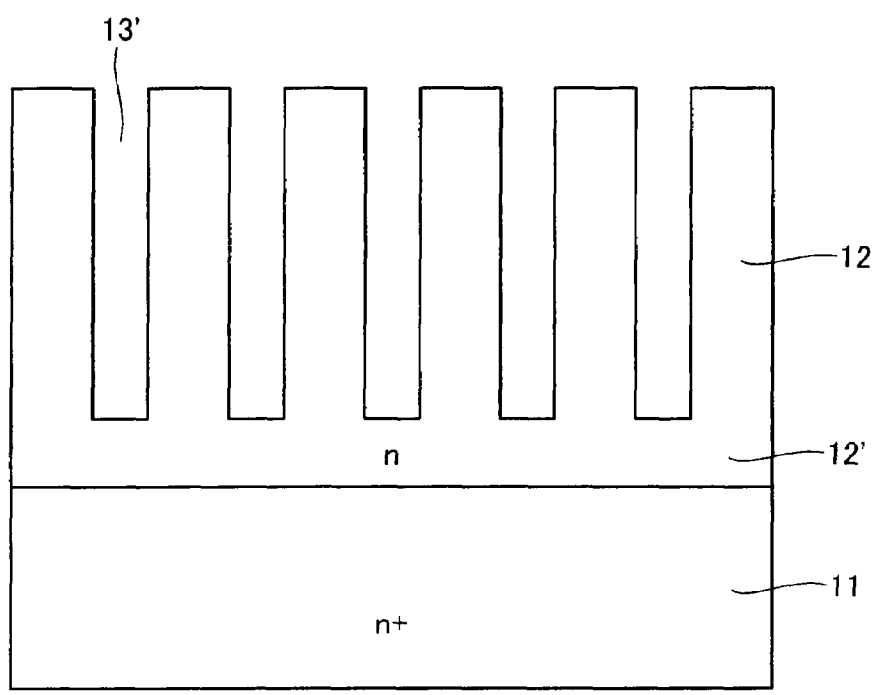
FIG. 3 is a cross-sectional view illustrative of the MOSFET of FIG. 1 in order of process step.
Figure 4:
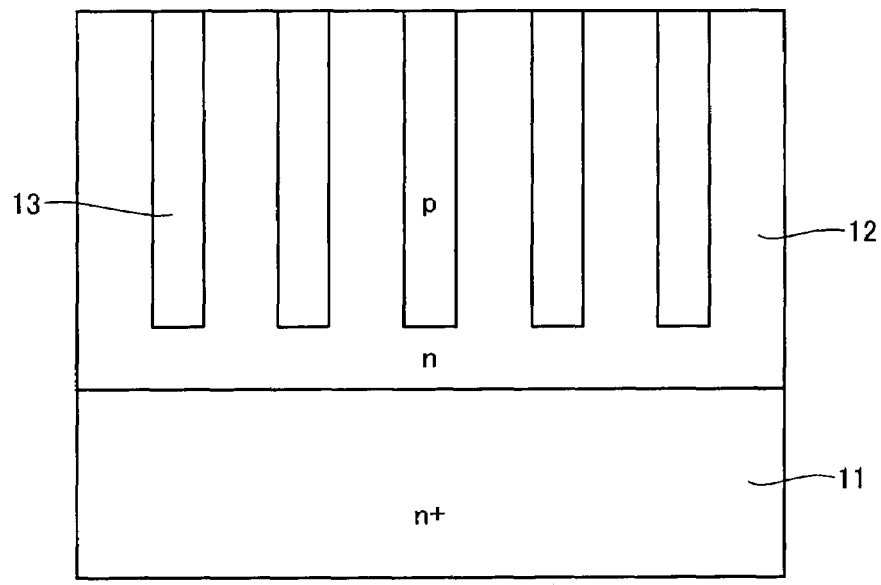
FIG. 4 is a cross-sectional view illustrative of the MOSFET of FIG. 1 in order of process step.
Figure 5:
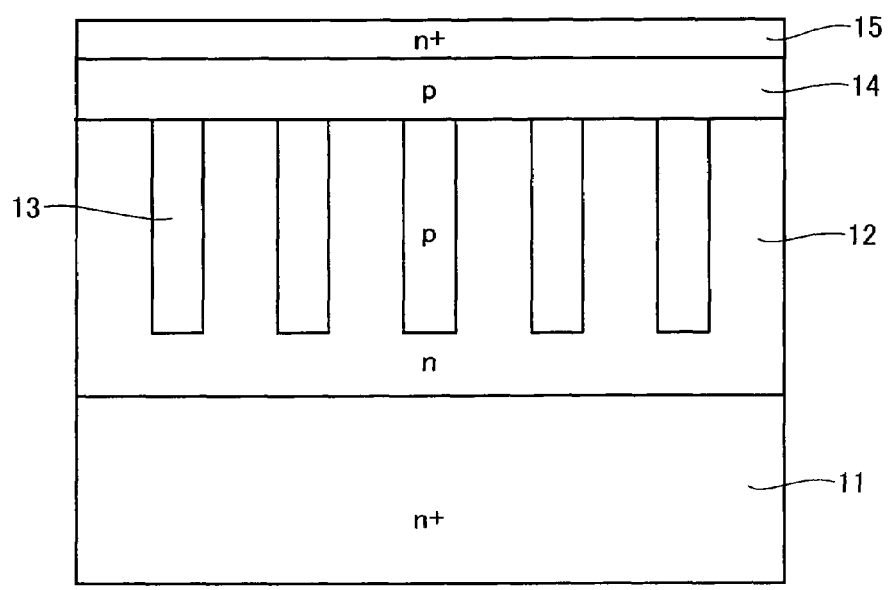
FIG. 5 is a cross-sectional view illustrative of the MOSFET of FIG. 1 in order of process step.

First, as shown in FIG. 2, an n-type layer 12' is epitaxially grown on the $n^+$-type silicon substrate 11. Then, as shown in FIG. 3, an anisotropic etching such as RIE (Reactive Ion Etching) is applied to form deep trenches 13' in the n-type layer 12' to form the n-type columns 12. Subsequently, as shown in FIG. 4, a process of epitaxial growth or the like is applied to bury a p-type layer in the trenches 13' to form the p-type columns 13. Further, as shown in FIG. 5, a p-type impurity such as boron and an n-type impurity such as arsenic are sequentially implanted through high-acceleration ion implantation and then thermally diffused to form the p-type body layer 14 and the $n^+$-type source layer 15. These layers are effective to prevent heat treatments from influencing excessively on the n-type columns 12 and the p-type columns 13.

Figure 6:
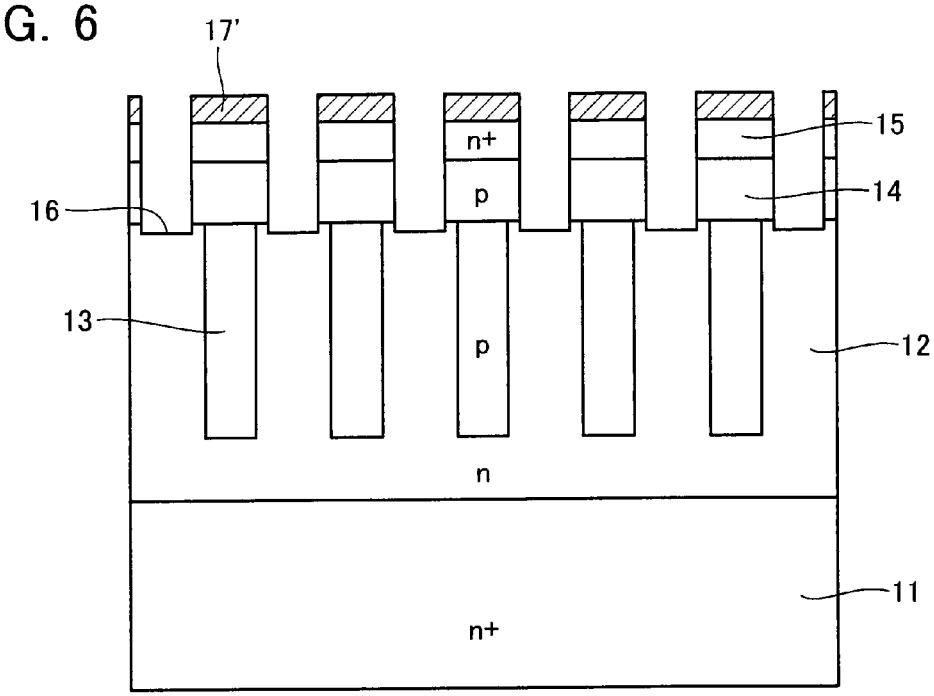
FIG. 6 is a cross-sectional view illustrative of the MOSFET of FIG. 1 in order of process step.
Figure 7:
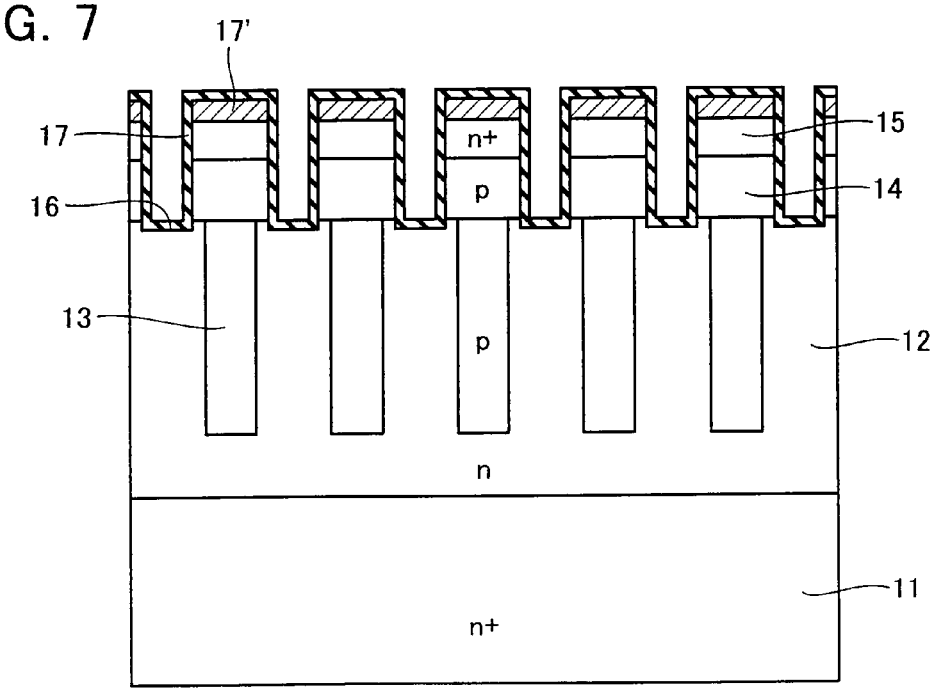
FIG. 7 is a cross-sectional view illustrative of the MOSFET of FIG. 1 in order of process step.
Figure 8:
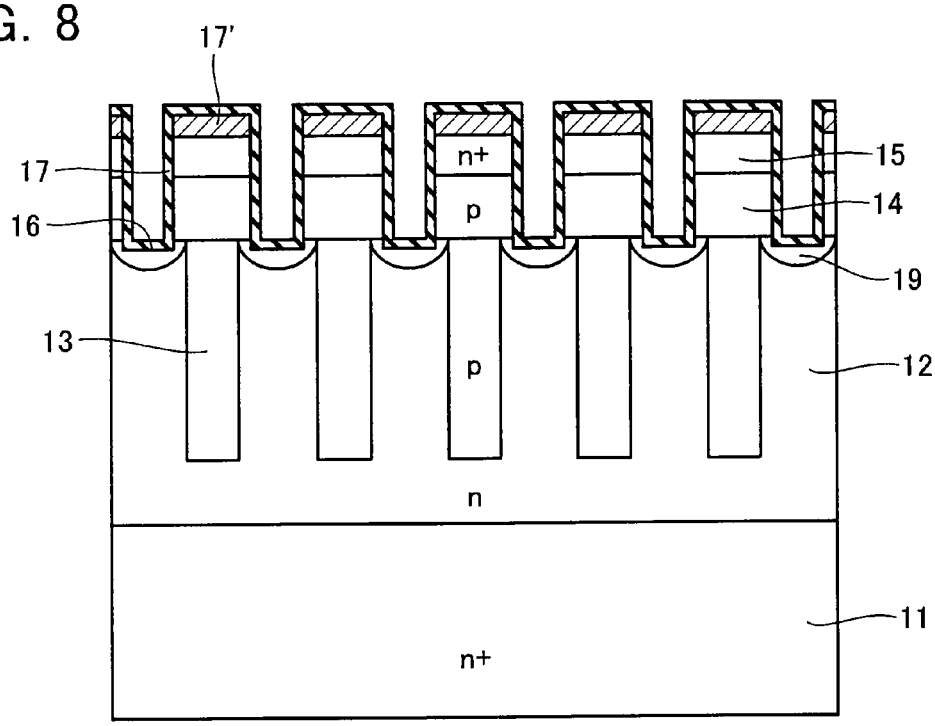
FIG. 8 is a cross-sectional view illustrative of the MOSFET of FIG. 1 in order of process step.
Figure 9:
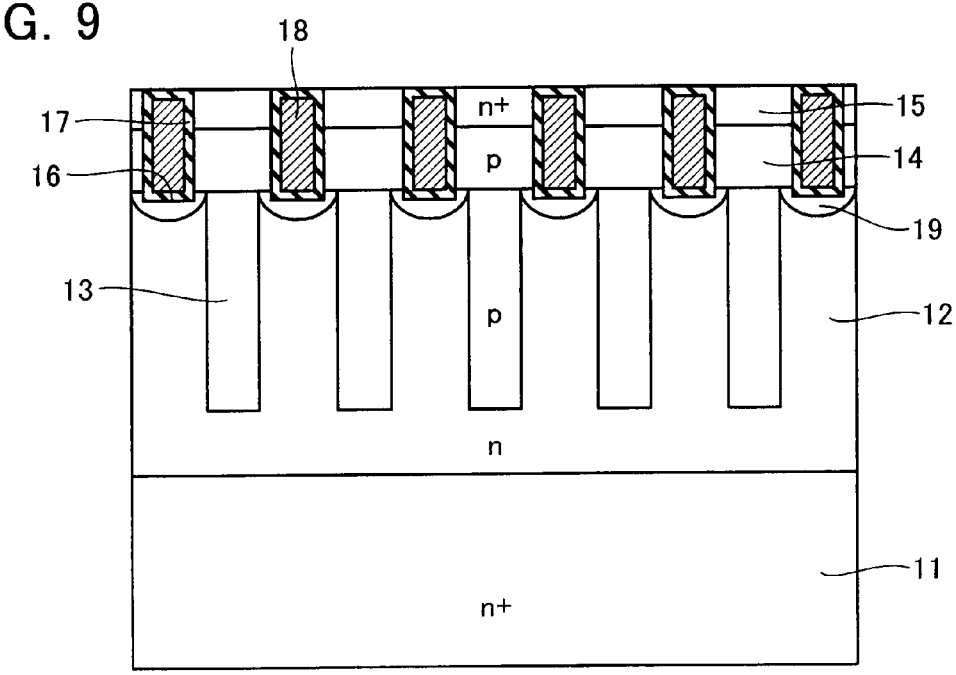
FIG. 9 is a cross-sectional view illustrative of the MOSFET of FIG. 1 in order of process step.

Next, as shown in FIG. 6, a mask member 17' such as a nitride film is formed through a photo etching. Then, an anisotropic etching is applied to form the trenches 16 from the $n^+$-type source layer 15 through the p-type body layer 14 to the depth of the n-type column 12. Thereafter, a process of thermal oxidation is applied while leaving the mask member 17' to form the gate oxide 17 covering the bottom and sidewall of the trench 16 as shown in FIG. 7. After formation of the gate oxide 17, as shown in FIG. 8, an n-type impurity such as arsenic is implanted into the bottom of the trench 16 through ion implantation and then thermally diffused to form the n-type diffusion layer 19. Thereafter, as shown in FIG. 9, polysilicon is buried in the trench 16 through CVD or the like. Then, the polysilicon is etched back and removed from above the trench 16 and the remainder is used as the gate electrode 18. Further, an oxide film is buried in the upper portion of the trench 16 to cover around the gate electrode 18 with the gate oxide 17.

Finally, as shown in FIG. 1, an anisotropic etching is applied to form the contact trench 20 between adjacent gate electrodes 18 from the $n^+$-type source layer 15 to the p-type body layer 14. A film of aluminum is buried in the contact trench 20 to form the source electrode 21. A film of aluminum is deposited on the lower surface of the $n^+$-type silicon substrate 11 to form the drain electrode 22, thereby completing the SJ MOSFET of this embodiment.

Figure 10:
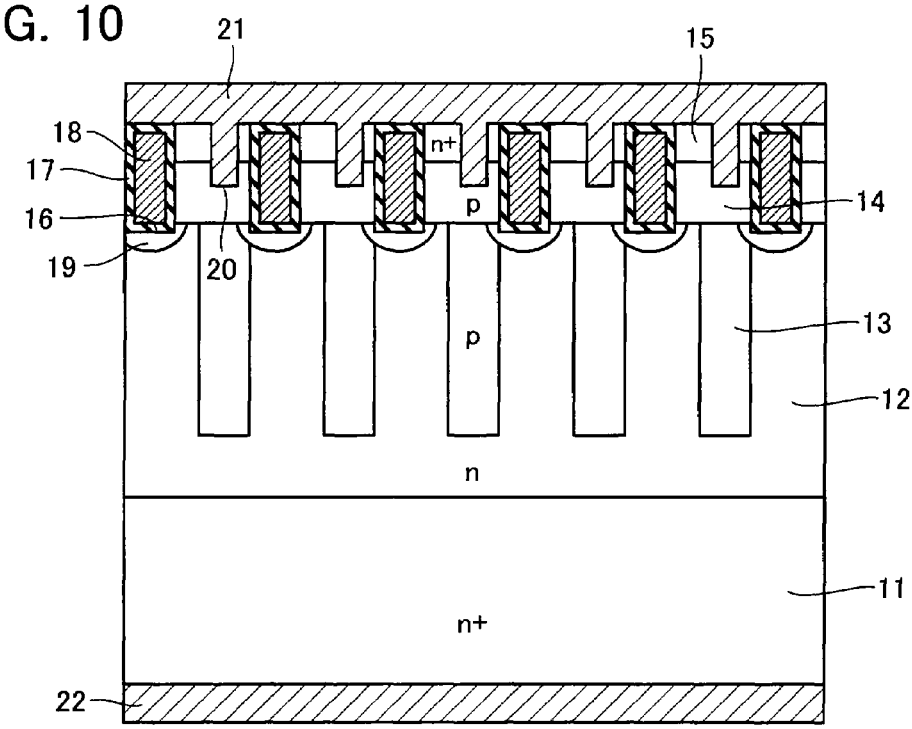
FIG. 10 is a cross-sectional view illustrative of the MOSFET of FIG. 1 when gate electrode trenches deviate along the surface.

FIG. 10 shows a structure of the SJ MOSFET when the position of formation of the trench 16 deviates along the surface from the positions of formation of the n-type column 12 and the p-type column 13. In this embodiment, the n-type diffusion layer 19 is formed at the bottom of the trench 16 by self-aligned diffusion. Therefore, even if the position of formation of the trench 16 deviates more or less, an n-channel formed along an interface between the p-type body layer 14 and the gate oxide 17 can be surely linked to the n-type column 12 via the n-type diffusion layer 19. As a result, it is possible to ensure an n-channel carrier passage and a lower on-resistance.

In this embodiment, contact with the p-type body layer 14 is realized by formation of the contact trench 20. Accordingly, in comparison with the case where the p-type body layer 14 and the $n^+$-type source layer 15 are connected with the plane electrode, the interval between the gate electrodes 18 can be made narrower. This allows fine pattering as well.

Second Embodiment

Figure 11:
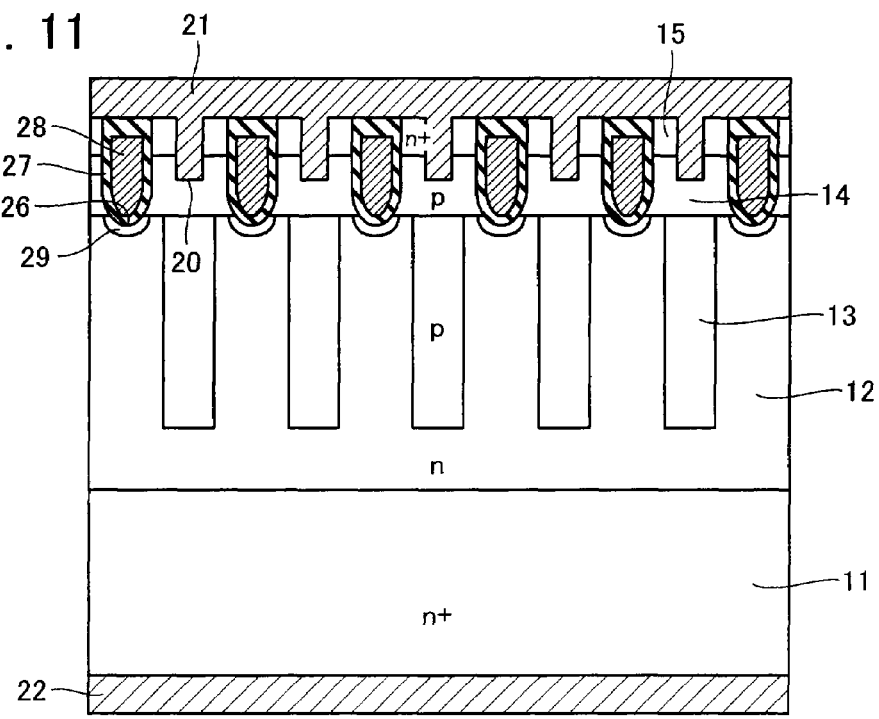
FIG. 11 is a cross-sectional view illustrative of an SJ MOSFET according to a second embodiment of the present invention.

FIG. 11 is a cross-sectional view illustrative of a structure of an SJ MOSFET according to a second embodiment of the present invention.

In this embodiment, a trench 26 containing a gate electrode 28 buried therein with a gate oxide 27 interposed therebetween has a V-shape or U-shape with a tapered tip on the bottom, different from the preceding embodiment. When the width of the tip is made narrower than the width of the opening in this way, the margin of deviation along the surface can be made larger than that in the preceding embodiment. In addition, the width of the n-type diffusion layer 29 can be made narrower than that in the preceding embodiment. This allows finer pattering.

Third Embodiment

Figure 12:
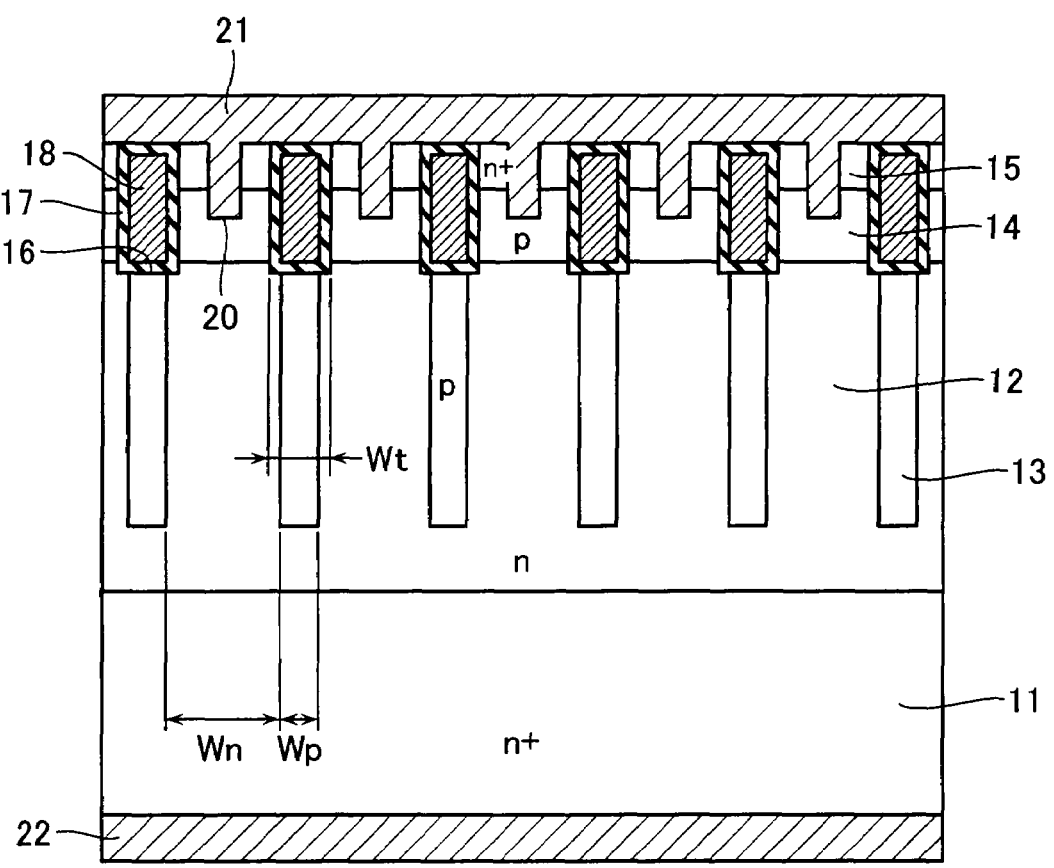
FIG. 12 is a cross-sectional view illustrative of an SJ MOSFET according to a third embodiment of the present invention.

FIG. 12 is a cross-sectional view illustrative of a structure of an SJ MOSFET according to a third embodiment of the present invention. The gate electrode 18 is formed on the n-type column 12 in the first and second embodiments while the gate electrode 18 is formed on the p-type column 13 in this embodiment. The width Wp of the p-type column 13 is designed narrower than the width Wt of the gate electrode trench 16. This allows the n-channel formed along the side of the trench 16 to be surely connected with the n-type column 12 even if the trench 16 deviates more or less along the surface. In this case, the relation between the width Wn of the n-type column 12 and the width Wp of the p-type column 13 is not particularly defined.

Figure 13:
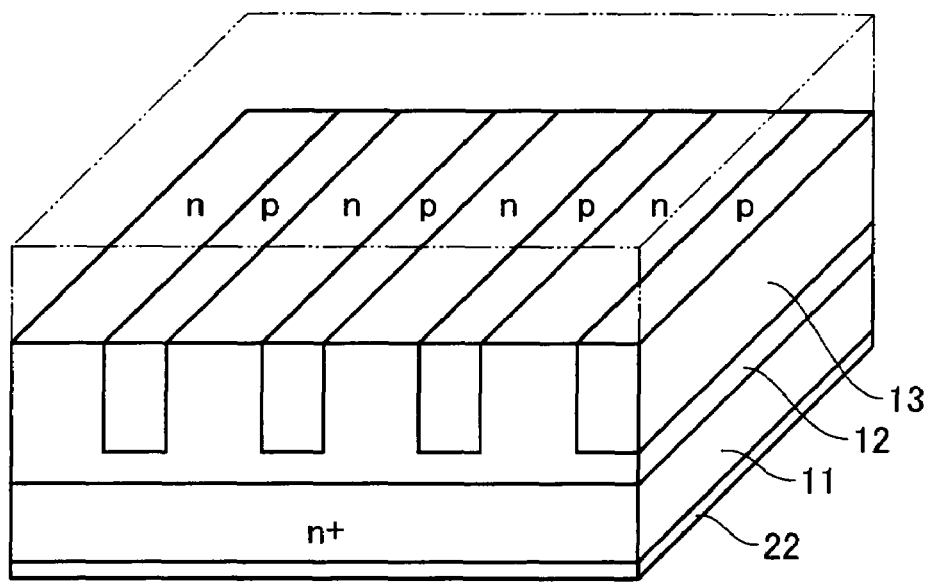
FIG. 13 is a perspective view illustrative of a partial section of an SJ MOSFET according to another embodiment of the present invention.
Figure 14:
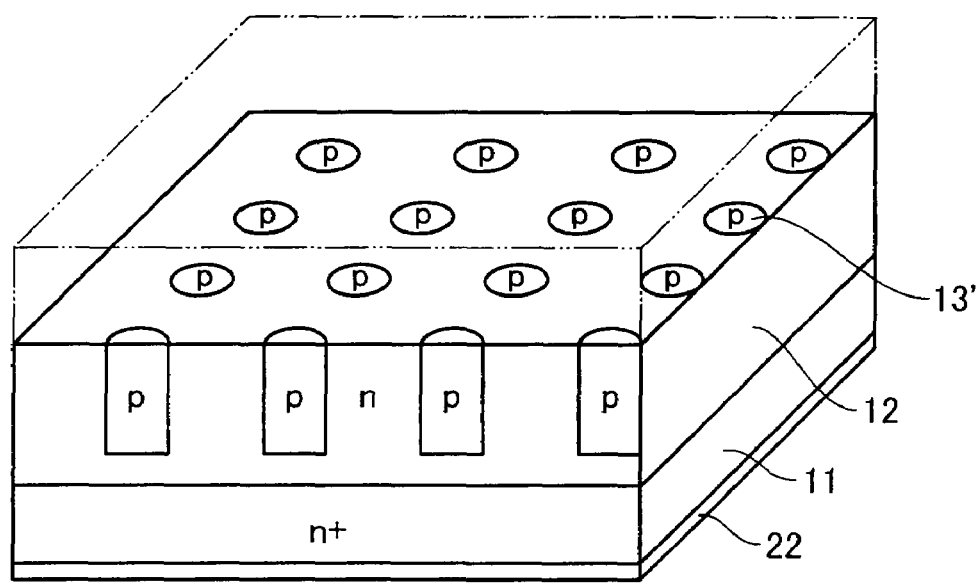
FIG. 14 is a perspective view illustrative of a partial section of an SJ MOSFET according to yet another embodiment of the present invention.

In the above description, three-dimensional shapes of the n-type columns 12 and the p-type columns 13 are not mentioned particularly. The n-type columns 12 and the p-type columns 13 may be arranged alternately in stripes as shown in FIG. 13. Alternatively, the p-type columns 13 may be arranged in the layer of n-type columns 12 at certain intervals in the form of a grid as shown in FIG. 14.

In the above embodiments, the p-type columns are formed through a process of burying. If the n-type epitaxial layer is formed of several split sub-layers, the p-type columns may be formed by repetitions of implanting and diffusing a p-type impurity to form each of the sub-layers.

In the above embodiments, the MOSFET is exemplified though the present invention is similarly applicable to an IGBT and the like having the SJ structure, needless to say.

What is claimed is:

1. A semiconductor device, comprising:
a first semiconductor layer of the first conduction type;
a first main electrode formed on one surface of said first semiconductor layer;
a second semiconductor layer of the first conduction type and a third semiconductor layer of the second conduction type formed above the other surface of said first semiconductor layer, said third semiconductor layer arranged periodically along the surface in association with said second semiconductor layer;
a fourth semiconductor layer of the second conduction type formed on the surfaces of said second semiconductor layer and said third semiconductor layer;
a fifth semiconductor layer of the first conduction type formed on a surface of said fourth semiconductor layer;
a control electrode formed in first trench with an insulator interposed therebetween, said first trench passing through said fourth and fifth semiconductor layers and reaching said second semiconductor layer;
a sixth semiconductor layer of the first conduction type extended from the bottom of said first trench;
a second trench passing through said fifth semiconductor layer and reaching said fourth semiconductor layer, said second trench being formed between adjacent ones of said first trench and above said third semiconductor layer; and
a second main electrode connected to said fourth and fifth semiconductor layers.

2. The semiconductor device according to claim 1, wherein said second semiconductor layer has a width in a direction of arrangement in association with said third semiconductor layer made wider than the width of said third semiconductor layer in said direction of arrangement.

3. The semiconductor device according to claim 1, wherein said first trench has a width of the bottom formed narrower than widths of other portions.

4. The semiconductor device according to claim 3, wherein said first trench is formed in a V-shape.

5. The semiconductor device according to claim 3, wherein said first trench is formed in a U-shape.

6. The semiconductor device according to claim 3, wherein said second semiconductor layer has a width in a direction of arrangement in association with said third semiconductor layer made wider than the width of said third semiconductor layer in said direction of arrangement.

7. The semiconductor device according to claim 1, wherein said second semiconductor layer and said third semiconductor layer are alternately formed in stripes.

8. The semiconductor device according to claim 1, wherein said third semiconductor layer has columns formed in said second semiconductor layer.

9. A semiconductor device, comprising:
a first semiconductor layer of a first conduction type;
a first main electrode formed on one surface of said first semiconductor layer;
a second semiconductor layer of the first conduction type and a third semiconductor layer of a second conduction type formed above the other surface of said first semiconductor layer, said third semiconductor layer arranged periodically along the other surface in association with said second semiconductor layer;
a fourth semiconductor layer of the second conduction type formed on the surfaces of said second semiconductor layer and said third semiconductor layer;
a fifth semiconductor layer of the first conduction type formed on a surface of said fourth semiconductor layer;
a control electrode formed in a first trench with an insulator interposed therebetween, said first trench passing through said fourth and fifth semiconductor layers and reaching said second semiconductor layer;
a second trench passing through said fifth semiconductor layer and reaching said fourth semiconductor layer, said second trench being formed between adjacent ones of said first trench and above said third semiconductor layer; and
a second main electrode connected to said fourth and fifth semiconductor layers,
wherein said third semiconductor layer has a width in a direction of arrangement in association with said second semiconductor layer made narrower than the width of said second semiconductor layer in said direction of arrangement or the width of said first trench in said direction of arrangement.

10. The semiconductor device according to claim 9, wherein said first trench has a width of the bottom formed narrower than widths of other portions.

11. The semiconductor device according to claim 10, wherein said first trench is formed in a V-shape.

12. The semiconductor device according to claim 10, wherein said first trench is formed in a U-shape.

13. The semiconductor device according to claim 9, wherein said second semiconductor layer and said third semiconductor layer are alternately formed in stripes.

14. The semiconductor device according to claim 9, wherein said third semiconductor layer has columns formed in said second semiconductor layer.

15. A semiconductor device, comprising:
a first semiconductor layer of a first conduction type;
a first main electrode formed on one surface of said first semiconductor layer;
a second semiconductor layer of the first conduction type and a third semiconductor layer of a second conduction type formed above the other surface of said first semiconductor layer, said third semiconductor layer arranged periodically along the other surface in association with said second semiconductor layer;
a fourth semiconductor layer of the second conduction type formed on the surfaces of said second semiconductor layer and said third semiconductor layer;
a fifth semiconductor layer of the first conduction type formed on a surface of said fourth semiconductor layer;
a control electrode formed in a first trench with an insulator interposed therebetween, said first trench passing through said fourth and fifth semiconductor layers and reaching said second semiconductor layer, said first trench having a width of the bottom made narrower than widths of other portions;
a second trench passing through said fifth semiconductor layer and reaching said fourth semiconductor layer, said second trench being formed between adjacent ones of said first trench and above said third semiconductor layer; and
a second main electrode connected to said fourth and fifth semiconductor layers.

16. The semiconductor device according to claim 15, wherein said first trench is formed in a V-shape.

17. The semiconductor device according to claim 15, wherein said first trench is formed in a U-shape.

18. The semiconductor device according to claim 15, wherein said second semiconductor layer and said third semiconductor layer are alternately arranged in stripes.

19. The semiconductor device according to claim 15, wherein said third semiconductor layer has columns arranged in said second semiconductor layer 20. The semiconductor device according to claim 1, wherein said third semiconductor layer has columns formed in said second semiconductor layer at certain intervals, and each bottom of the columns does not reach the other surface of said first semiconductor layer.

21. The semiconductor device according to claim 9, wherein said third semiconductor layer has columns formed in said second semiconductor layer at certain intervals, and each bottom of the columns does not reach the other surface of said first semiconductor layer.

22. The semiconductor device according to claim 15, wherein said third semiconductor layer has columns formed in said second semiconductor layer at certain intervals, and each bottom of the columns does not reach the other surface of said first semiconductor layer.

\* \* \* \* \*